(12) United States Patent
Kiyotoshi et al.

(10) Patent No.: US 6,599,794 B2
(45) Date of Patent: Jul. 29, 2003

(54) METHOD OF MANUFACTURING A SEMICONDUCTOR DEVICE AND SEMICONDUCTOR DEVICE

(75) Inventors: Masahiro Kiyotoshi, Sagamihara (JP); Kazuhiro Eguchi, Chigasaki (JP); Masaaki Nakabayashi, Kawasaki (JP); Fumihiko Inoue, Aizuwakamatsu (JP)

(73) Assignees: Kabushiki Kaisha Toshiba, Tokyo (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 10/195,484

(22) Filed: Jul. 16, 2002

(65) Prior Publication Data

US 2003/0017669 A1 Jan. 23, 2003

(30) Foreign Application Priority Data

Jul. 17, 2001 (JP) .......................... 2001-217226

(51) Int. Cl.$^7$ .......................................... H01L 21/8242
(52) U.S. Cl. ...................... 438/240; 438/253; 438/396
(58) Field of Search ................. 438/3, 238–240, 438/253–256, 381, 396, 399

(56) References Cited

U.S. PATENT DOCUMENTS

| | | | |
|---|---|---|---|
| 5,877,062 A | | 3/1999 | Horii |
| 6,168,991 B1 | * | 1/2001 | Choi et al. .................. 438/254 |
| 6,255,187 B1 | | 7/2001 | Horii |
| 6,294,425 B1 | | 9/2001 | Hideki |
| 6,417,561 B1 | * | 7/2002 | Tuttle .......................... 257/659 |

* cited by examiner

*Primary Examiner*—Jey Tsai
(74) *Attorney, Agent, or Firm*—Finnegan, Henderson, Farabow, Garrett & Dunner, L.L.P.

(57) ABSTRACT

A method of manufacturing a semiconductor device comprising forming a sacrificial layer including one or more conductive film on a semiconductor substrate, forming a cavity used as a template of electroplating in the sacrificial layer, growing a metal film on a surface of the cavity by the electroplating using the conductive layer as a seed layer so that a cylindrical or convex electrode can be formed, and removing the sacrificial layer so that the electrode can be formed.

16 Claims, 11 Drawing Sheets

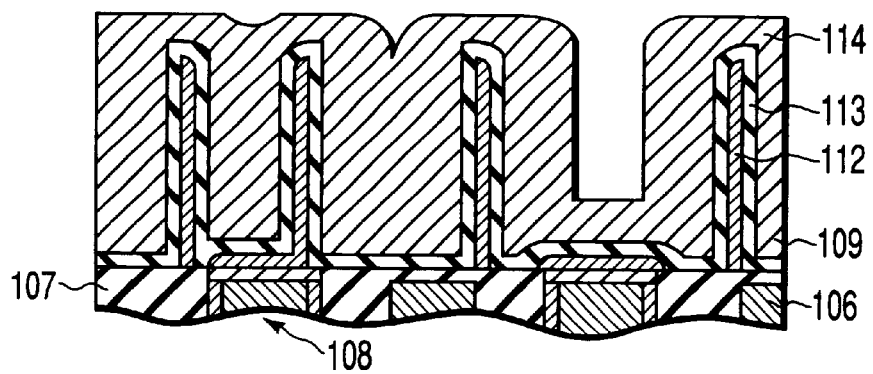
FIG. 1E
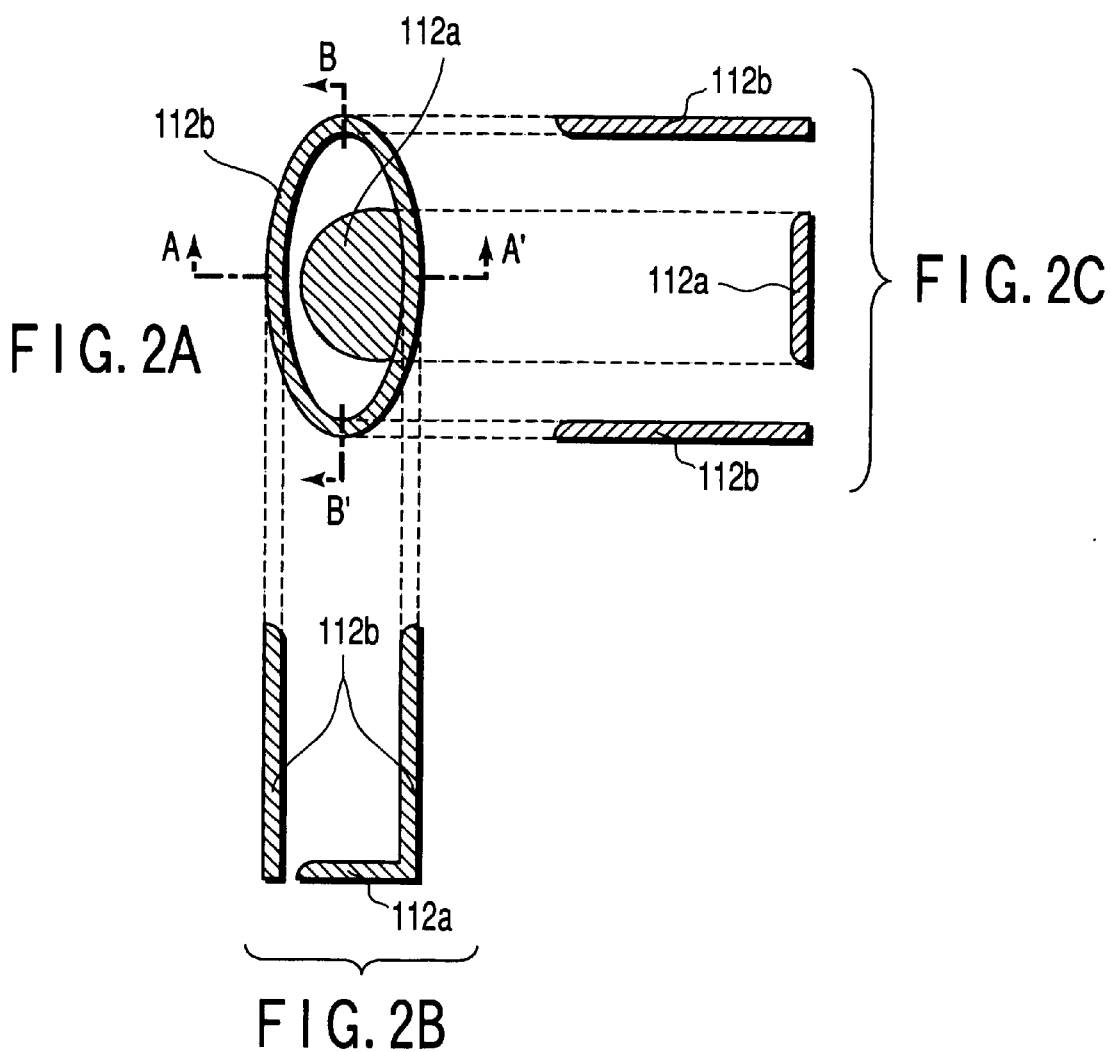
FIG. 2A
FIG. 2B
FIG. 2C

METHOD OF MANUFACTURING A SEMICONDUCTOR DEVICE AND SEMICONDUCTOR DEVICE

CROSS-REFERENCE TO RELATED APPLICATIONS

This application is based upon and claims the benefit of priority from the prior Japanese Patent Application No. 2001-217226, filed Jul. 17, 2001, the entire contents of which are incorporated herein by reference.

BACKGROUND OF THE INVENTION

1. Field of the Invention

The present invention relates to a method of manufacturing a semiconductor device and a semiconductor device. In particular, the invention relates to a technology of forming an electrode using an electroplating method.

2. Description of the Related Art

SRAM (Static Random Access read write Memory) and EEPROM (Electrically Erasable and Programmable Read Only Memory) store an information by the combination of transistors. Moreover, a DRAM (Dynamic Random Access Memory) stores an information by the combination of transistor and capacitor. The integrated circuit of the above memory is realized by the combination of a MOS transistor and a MOS capacitor. However, a cell area is reduced; for this reason, it is difficult to realize the above integrated circuit by the combination of a transistor and a capacitor.

In particular, an S/N ratio (Signal to Noise ratio) of the capacitor should not be reduced even if the maximum (critical) micro-fabricating dimension becomes small. For this reason, there is a need of continuing to obtain a constant capacitance of capacitor. In order to obtain enough capacitance of capacitor, functional material thin films such as $Ta_2O_5$, $SrTiO_3$, $Ba_xSr_{1-x}TiO_3$ (BST) and $PbZr_xTi_{1-x}O3$ (PZT) have been employed as a capacitor dielectric film. The functional material thin film shows a higher permittivity than a silicon oxide film, silicon nitride film/silicon oxide film laminated film (NO film). Recently, a device such as Ferroelectric Random Access read write Memory which enables a quite new function has been proposed.

High dielectric films (ferroelectric film) such as the above-mentioned $Ta_2O_5$, $SrTiO_3$, $Ba_xSr_{1-x}TiO_3$ (BST) and $PbZr_xTi_{1-x}O3$ (PZT) are promising as a capacitor dielectric film. In general, the high dielectric films (ferroelectric film) are single or composite metal oxides.

However, it is difficult to use a polycrystalline silicon film, which has been conventionally used as a capacitor electrode, as the electrode for metal oxide dielectric. The reason is as follows. That is, in the case of using the polycrystalline silicon as the electrode, the surface of the polycrystalline silicon is oxidized during forming a capacitor metal oxide dielectric film; as a result, a silicon oxide is formed. The formed silicon oxide film functions as a layer having a low permittivity.

Thus, in the case of forming a capacitor of a large scale integrated circuit using the above mentioned high dielectric films (ferroelectric film), noble metals such as platinum and ruthenium. Because these noble metals are not oxidized even in an oxidizing ambient, or are still conductive even if they are oxidized.

For the micro-patterning of the noble metals, the following methods are employed. One is a method of forming a noble metal film by PVD or CVD method, and thereafter, carrying out micro-patterning by anisotropic etching such as RIE and the like. Another is a method of filling a noble metal film in a micro cavity used as a template, and thereafter, patterning the noble metal by a CMP method.

However, the noble metal has a low chemical reactivity and has a low adhesion with a substrate; for this reason, there is a problem such that it is hard to pattern the noble metal according to any of the above methods. In particular, materials such $Ta_2O_5$ and $Al_2O_3$ with a high permittivity of about 30 to 40 are amorphous and used as a capacitor dielectric film. In this case, in order to maximize a capacitor effective area while restricting a height of a capacitor cell, it is indispensable to employ a cylinder structure using both sides of a cylindrical electrode. Moreover, in the case of using the above materials BST and PZT, it is difficult to obtain a desired stored charge density or remnant polarization by a planar capacitor. For this reason, there is a need of micro-patterning the noble metal electrode into at least pedestal shape. However, generally, the noble metal is chemically inactive, therefore there are various problems to form a cylindrical or pedestal shape electrodes.

Electroplating has been employed as the new noble metal forming method instead of normal PVD or CVD methods. Electroplating has the following merits. That is, the process temperature is low (usually, the same as room temperature), and in the case of making a selective growth by electroplating, it is almost no necessary to pattern the noble metal. Further, the electroplating is not a vacuum process; therefore, it is instrumentally easy to prevent metal contamination on the backside of substrate, the process cost is low, and further, the apparatus can be made compact.

The following technology has been proposed as the conventional technology of forming a cylindrical electrode by electroplating. A template layer is formed on a substrate. A cavity is formed in the template layer so that the surface of the cavity can be formed with a capacitor electrode. A noble metal film is grown on the entire surface of the substrate. This is the application of the conventional method, which has been widely and practically used in a copper interconnect forming process.

One example of the conventional will be described below with reference to FIG. 9A to FIG. 9D. In this case, in the following conventional manufacturing method, only one step will be described below. The above one step is a step of forming a lower electrode on a contact plug buried and formed in a contact hole formed at an interlayer dielectric (insulating) film.

First, as shown in FIG. 9A, a silicon nitride film 909 and a silicon oxide film 910 are sequentially formed on an interlayer dielectric film 107 and a contact plug 108 so that a template layer can be formed. By the public-known lithography technology, the silicon nitride film 909 and the silicon oxide film 910 are patterned to form a cavity 911 in which a lower electrode is formed. A ruthenium film 912, which will become a seed layer, is formed on the entire surface of the substrate by sputtering.

Then, as shown in FIG. 9B, a ruthenium film 913 is grown by electroplating using the ruthenium film 912 as a seed. Here, the deposition is stopped before the ruthenium film 913 is fully filled in the cavity 911.

As shown in FIG. 9C, a photo-resist film 914 is buried in the cavity 911. Then, CMP is carried out so that unnecessary ruthenium films 912 and 913 on the interlayer dielectric film can be removed.

As shown in FIG. 9D, the above photo-resist film 914 and the silicon oxide film 910 are removed, and thereby, a cylindrical capacitor lower electrode is formed.

Further, according to the manufacturing method, the ruthenium film 913 is fully buried in the cavity 911, and thereafter, the CMP method is carried out so that the ruthenium film 913 on the silicon oxide film 910 and the silicon oxide film 910 can be removed, and thereby, a cylindrical lower electrode can be formed.

However, the above conventional manufacturing method has the following problems. That is, it is assumed that an aspect ratio of the cavity becomes 5 or more after 0.1-micron generation. In order to uniformly grow an electroplating film in the cavity, there is a need of forming the seed layer up to the bottom of the cavity. However, it is difficult to form a uniform seed layer on a sidewall of the cavity by sputtering. In order to form the uniform seed layer on the sidewall, a thicker sputtered film must be formed; as a result, it is difficult to make thin the thickness of a cylinder wall.

When the seed layer is formed over the cavity having a large aspect ratio by sputtering, the sidewall near the bottom of the cavity is almost not covered with the seed layer.

Further, the electroplating seed layer is formed on the entire surface of the substrate; therefore, the noble metal film formed by electroplating is also formed on the entire surface of the substrate. For this reason, there is a problem in that the thick noble metal film must be removed by the CMP method.

While the silicon oxide film of the template layer is being removed by wet etching, an etching liquid penetrates through the noble metal film interface having a poor adhesion, and then, the under-layer, that is, the silicon oxide film of the interlayer dielectric film is etched. For this reason, a problem arises such that there is a possibility of generating a void.

As described above, there are the problems on practical use in the conventional technology of forming a high dielectric film capacitor lower electrode, in particular, a cylindrical electrode. In particular, it has been considered that it is impossible to form the cylindrical electrode using electroplating.

BRIEF SUMMARY OF THE INVENTION (1) According to one aspect of the invention, there is provided a method of manufacturing a semiconductor device comprising: forming a sacrificial layer including one or more conductive film on a semiconductor substrate; forming a cavity used as a template of electroplating in the sacrificial layer; growing a metal film on a surface of the cavity by the electroplating using the conductive layer as a seed layer so that a cylindrical or pedestal electrode can be formed; and removing the sacrificial layer so that the cylindrical electrode can be remained.

(2) According to another aspect of the invention, there is provided a method of manufacturing a semiconductor device comprising: forming a sacrificial layer including a conductive film and an insulating electroplating inhibition layer on a top surface of the sacrificial layer; forming a cavity used as a template of electroplating in the sacrificial layer; forming a columnar contact electrode in the cavity by the electroplating using the conductive layer as a seed layer; removing the sacrificial layer so that an upper surface of the contact electrode can be exposed; forming an interlayer insulating film covering the contact electrode after the upper surface of the contact electrode is exposed; and etching back an surface of the interlayer insulating film.

(3) According to another aspect of the invention, there is provided a semiconductor device having a capacitor formed on a plug electrode of a semiconductor substrate, comprising: a pair of electrodes configuring the one of capacitor electrodes, comprising a bottom conductive film formed on a plug electrode, and a cylindrical sidewall conductive film formed only part of the bottom conductive film.

BRIEF DESCRIPTION OF THE SEVERAL VIEWS OF THE DRAWING

FIG. 1A to FIG. 1E are cross-sectional views showing each step of a method of manufacturing a semiconductor device according to a first embodiment of the present invention;

FIG. 2A to FIG. 2C are views showing a structure of a lower electrode;

DETAILED DESCRIPTION OF THE INVENTION

The embodiments of the present invention will be described below with reference to the accompanying drawings.

[First Embodiment]

A method of manufacturing a semiconductor device according to a first embodiment of the present invention will be described below with reference to FIG. 1A to FIG. 1E. In the first embodiment, a carbon film is used as a template layer of cylinder electrode and an electroplating seed layer.

Figure 1A:
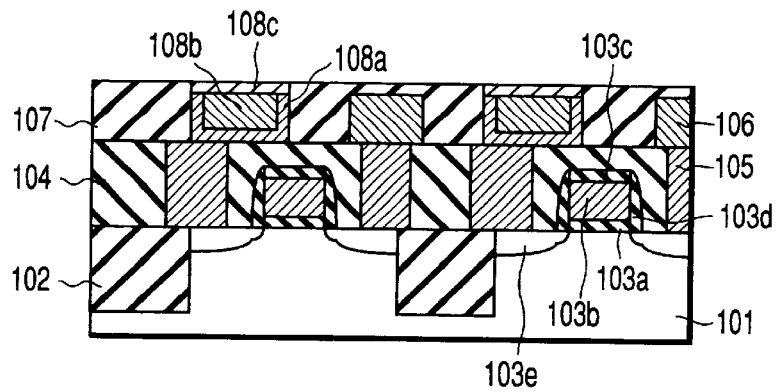

First, as shown in FIG. 1A, a well is formed on a surface of a p-type or n-type silicon substrate 101. In this case, a p-well is formed in an n-channel transistor forming region. Further, an n-well is formed in a p-channel transistor forming region (not shown). An impurity concentration of the silicon (Si) substrate 101 is about $5 \times 10^{15}$ cm$^{-3}$, for example. Next, a trench having a depth of about 0.2 $\mu$m is formed at regions other than an isolation region in the silicon substrate 101 using reactive ion etching (RIE). Thereafter, an insulating film is buried and formed in the trench. An isolation region 102 is formed using a so-called STI (Shallow Trench Isolation) technology.

Next, a gate oxide film 103a having a thickness of about 60 nm is formed as a gate insulating film of transistor. In a memory cell part, a gate electrode material 103b to be a word line is deposited. In this first embodiment, although the explanation is omitted, a so-called polycide structure (e.g., multi-layer film comprising polysilicon film WSi$_2$ film, each of which has a thickness of about 50 mm) may be employed in order to make small resistance. Other structure, for example, a lamination film structure using only simple polysilicon layer and using polysilicon layer and W film may be employed.

Sequentially, a gate cap layer 103c comprising a silicon nitride film (Si$_3$N$_4$) is formed on the gate electrode material 103b. Thereafter, a resist film (not shown) is formed in a gate electrode forming region on the gate cap layer 103c. Sequentially, the gate cap layer 103c is patterned using the resist as a mask, and thereafter, the resist is removed. Further, the gate electrode material 103b is patterned using the gate cap layer 103 as a mask. By the above patterning, the gate electrode 103b to be a word line is formed in the memory cell part.

An n$^-$ or p$^-$ type impurity diffusion layer to be a source/drain diffusion layer is formed on the desired region surface of the silicon substrate 101 by ion implantation. In this case, the resist film (not shown), the gate cap layer 103c and the gate electrode 103b are used as a mask.

A silicon nitride film (Si$_3$N$_4$) is deposited on the entire surface by an LP-CVD method so that the film thickness becomes about 20 nm. Then, etching such as RIE is carried out with respect to the silicon nitride film so that a sidewall insulating film 103d can be formed at the sidewall of the gate electrode. An n$^+$ (or p$^+$) type impurity diffusion layer is formed in a desired region by ion implantation. The impurity diffusion layer is a source/drain diffusion layer 103e having an LDD structure. In this case, the resist film (not shown), the sidewall insulating film 103d and the gate cap layer 103c are used as a mask.

Next, a first interlayer insulating film 104 comprising BPSG is deposited by the CVD method. Then, the entire surface of the first interlayer insulating film 104 is planarized using the CMP (Chemical Mechanical Polish) method. The first interlayer insulating film 104 is planarized, and thereby, the approximately entire surface of wafer is planarized.

A resist film having a hole pattern is formed on the first interlayer insulating film 104, and thereafter, the first interlayer insulating film 104 is etched so that a contact hole connecting with the source/drain diffusion layer 103e can be formed in the first interlayer insulating film 104.

The resist film is removed, and thereafter, an n$^+$ type polysilicon layer doping impurities such as phosphorus (P$^+$) and arsenic (As$^+$) is deposited on the entire surface by the LP-CVD method. Then, a contact 105 comprising n$^+$ type polysilicon is fully buried and formed in the contact hole using etch back such as CMP and RIE. The buried contact 105 comprising n$^+$ type polysilicon is electrically connected with the source/drain diffusion layer 103e.

A bit line 106 connecting with the source/drain diffusion layer 103e is formed on the first interlayer insulating film 104. Sequentially, a second interlayer insulating film 107 is formed so as to cover the bit line 106. A contact hole is formed in the second interlayer insulating film 107 so that the contact 105 having no connection with the bit line 106 can be exposed. A barrier metal 108a and a tungsten film 108b are buried in the contact hole. A metal film on the second interlayer insulating film 107 is removed by the CMP method. Next, the surface of the metal films 108a and 108b buried in the contact hole is removed by the RIE. Next, a ruthenium film 108c is formed on the entire surface by sputtering. The ruthenium films other than the contact hole are removed by the CMP method so that a contact plug 108 can be formed in the contact hole. The contact plug 108 is connected with the source/drain diffusion layer 103e via the contact 105.

In the following description of the manufacturing method, the above silicon substrate 101, isolation region 102, transistor 103, first interlayer insulating film 104 and contact 105 are not illustrated in FIG. 1B to FIG. 1E.

Figure 1B:
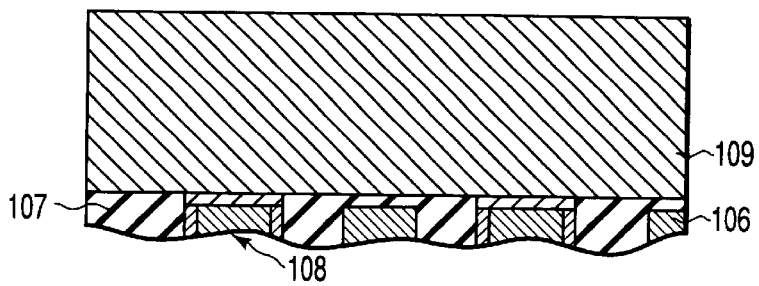
Figure 1C:
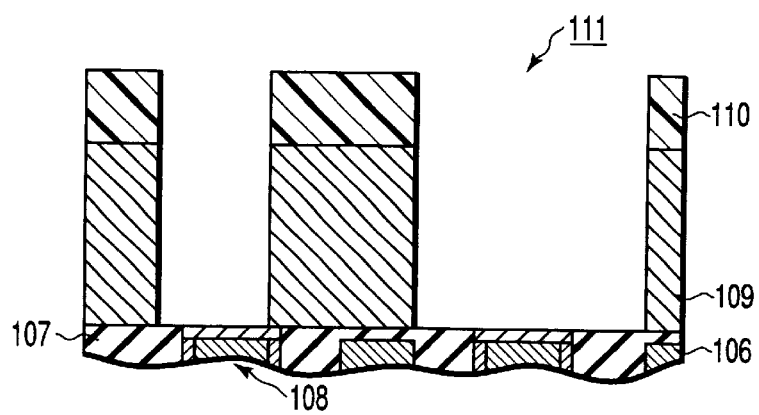

As shown in FIG. 1B, a carbon film 109 having a thickness of 1 μm is deposited as a sacrificial layer by the PVD method. Sequentially, as shown in FIG. 1C, a photo-resist film 110 is coated onto the carbon film 109, and thereafter, the resist film 110 is formed with an opening by public-known lithography technology. Then, the carbon film 109 is etched using the resist film 110 as mask so that a cavity 111 can be formed as a capacitor template.

Figure 1D:
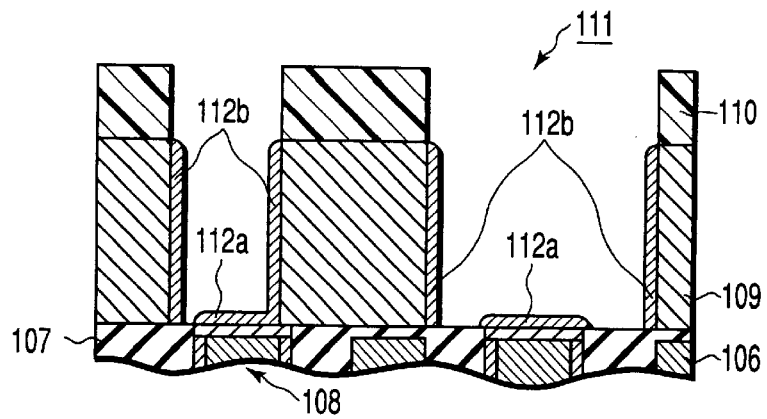

As shown in FIG. 1D, a ruthenium film (112a, 112b) is grown in the cavity 111 by electroplating using the carbon film 109 as a seed electrode.

The electroplating conditions are as follows. More specifically, an electroplating solution consists of RuNOCl$_3$ (1 to 10 g/L) and H$_2$SO$_4$ (50 to 100 g/L). A pH of the electroplating solution is set to a range from 0.5 to 3. A temperature of the electroplating solution is set to a range from 55° C. to 77° C. A current density is set to a range from 0.001 to 0.03 A/cm$^2$.

The upper surface of the carbon film 109 is covered with the photo-resist film 110. Therefore, the ruthenium film 112 is selectively grown in only portions exposed in the cavity 111 of the surface of the carbon film 109 exposed in the cavity 111 and the upper surface of the contact plug 108.

An electroplating time is controlled, and thereby, the ruthenium film 112 having a desired thickness is formed. In this case, electroplating is carried out until a connection is made between the ruthenium film 112a grown on the contact plug 108 and the ruthenium film 112b grown on the surface of the carbon film 109. Incidentally, a design is made so that the sidewall of the cavity 111 can be connected over the contact hole, and thereby, the ruthenium films 112a and 112b can be directly connected to each other.

As shown in FIG. 1E, by down flow ashing using O$_2$ and CF$_4$, the photo-resist film 110 and the carbon film 109 are removed. Also, it is possible to remove the photo-resist film 110 by organic solvent or sulfuric acid hydrogen peroxide mixed solution. The ruthenium is not soluble in the organic solvent or sulfuric acid hydrogen peroxide mixed solution.

Moreover, the following method is effective as the removal method of the carbon film 109. That is, annealing is carried out at a low temperature of about 400° C. under oxidizing atmosphere. By the above removal method, it is possible to selectively remove the carbon film with respect to the ruthenium film. Of course, during the removal step of the carbon film, no etching is occurred to the silicon oxide film 105, and there is no possibility of damaging the underlying layer. The above steps are taken, and thereby, a capacitor lower cylindrical can be formed.

Next, a Ta$_2$O$_5$ film 113 is formed by the CVD method, and then, a titanium nitride film 114, which becomes a capacitor upper electrode, is formed by the CVD method, and thereby, a capacitor is formed.

Insulating films and interconnection lines are formed, and thereby, a semiconductor device is formed; in this case, the steps after that are neglected. In this first embodiment, the $Ta_2O_5$ film is used as the dielectric film. Metal oxide dielectric films such as $ZrO_2$, $HfO_2$ and $Al_2O_3$ may be used. Further, in this first embodiment, the CVD method is employed as the method of depositing the dielectric film; in this case, it is possible to employ a method excellent in step coverage, such as ALD (Atomic Layer Deposition) method.

In this first embodiment, the titanium nitride is used as the upper electrode; in this case, ruthenium and platinum is formed by the CVD method, and thereby, it is possible to form a capacitor, which is excellent in resistance and has high permittivity. However, the CVD method is employed, and thereby, there is a possibility that noble metal contamination is generated in the backside of the substrate and the peripheral portions thereof, as pointed out in the conventional technology. Considering the above possibility, titanium nitride is used as the upper electrode in this embodiment.

In this embodiment, the formed lower electrode 112 has a shape as shown in FIG. 2A to FIG. 2C. In the lower electrode 112, no electrode material is formed at a part of the bottom portion as compared with a general cylindrical electrode. However, in the case of the cylindrical electrode, a ratio of the bottom portion to the entire surface area is several percents (%) or less; therefore, there is no problem in practical use. FIG. 2A is a top plane view showing a structure of the lower electrode 112. FIG. 2B is a cross-sectional view taken along the line A—A of FIG. 2A. FIG. 2C is a cross-sectional view taken along the line B—B of FIG. 2A.

In the above first embodiment, the sacrificial layer, that is, the carbon film (conductive film) 109 is used as the seed layer in electroplating, and thereby, there is no need of newly forming the seed layer, and the sidewall of the cylindrical ruthenium film (lower electrode) 112 can be prevented from being made thick.

Further, in a state that the resist film 113 remains on the upper portion of the carbon film 109, the ruthenium film 112 is formed, and thereby, it is possible to omit a step of removing the ruthenium film 112 on the template layer.

To form the contact plug, the ruthenium film is buried in the contact hole. In this case, in place of ruthenium, it is possible to bury a conductive film having acid resistance, such as WN, TiAlN and TaSiN.

In the method of this embodiment, there is a possibility that part of the upper surface of the contact plug is exposed outside the cylinder electrode by the alignment difference in the photolithography step. Thus, it is important to bury a conductive film, which has no problem even if it contacts with the dielectric film, in the upper surface of the contact plug. Moreover, it is important to form the contact plug out of a conductive film, which has no problem even if it contacts with the dielectric film.

[Second Embodiment]

A method of manufacturing a semiconductor device according to a second embodiment of the present invention will be described below with reference to FIG. 3A to FIG. 3D.

Figure 3A:
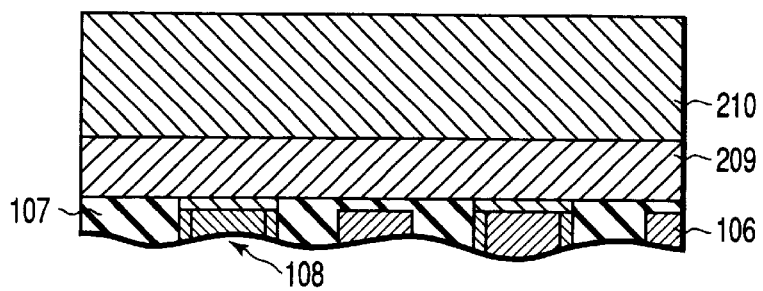
FIG. 3A to FIG. 3D are cross-sectional views showing each step of a method of manufacturing a semiconductor device according to a second embodiment of the present invention.

A structure as shown in FIG. 3A is formed using the steps described referring to FIG. 1A in the above first embodiment. In FIG. 3A to FIG. 3D, the above silicon substrate 101, isolated layer 102, transistor 103, first interlayer insulating film 104 and contact 105 are not illustrated.

Next, a boron-doped first amorphous silicon film 209 is formed. Further, a boron-doped second amorphous silicon film 210 is formed on the first amorphous silicon film 209.

In this case, the first amorphous silicon film 209 has a thickness of 50 nm; on the other hand, the second amorphous silicon film 210 has a thickness of 1000 nm. The above first and second amorphous silicon films 209 and 210 are used as a sacrificial layer.

Each boron concentration of the first and second amorphous silicon films 209 and 210 is adjusted so that a conductivity of the second amorphous silicon film 210 becomes about ½ of that of the boron-doped first amorphous silicon film 210.

The first and second amorphous silicon films 209 and 210 are formed by a thermal CVD method. In this case, a CVD gas is $Si_2H_6$ and $B_2H_6$, and the deposition temperature is 300° C.

Figure 3B:
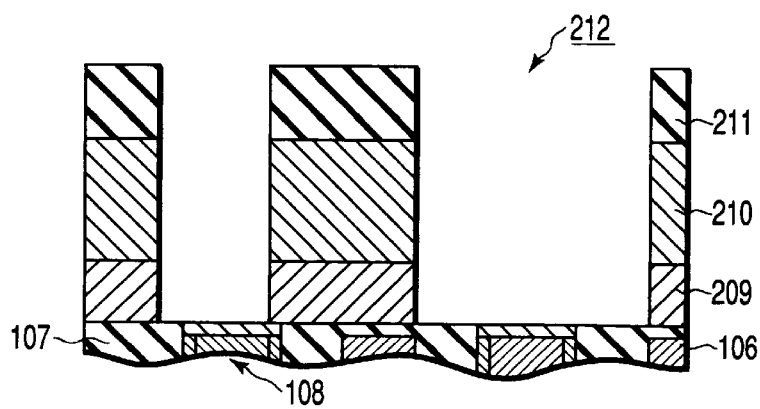

Sequentially, as FIG. 3B shows, a photo-resist film 211 is coated on the second amorphous silicon film 210. An opening is formed in the photo-resist film 211 by the public-known lithography technology. The first and second amorphous silicon films 209 and 210 are etched by RIE using the photo-resist film 211 as a mask so that a cavity 212 can be used as a capacitor template.

Figure 3C:
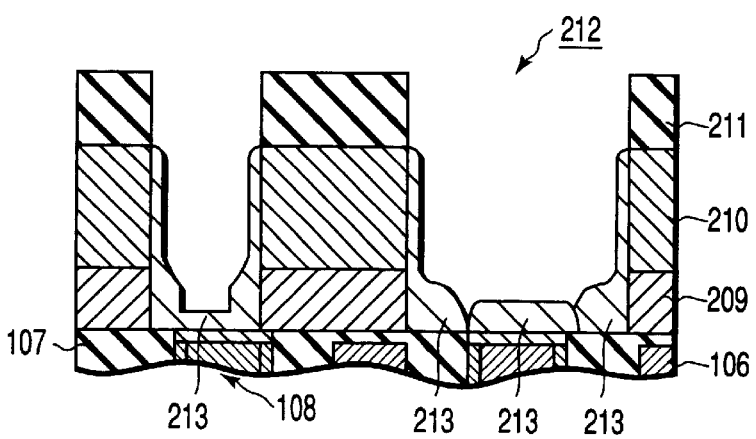

As shown in FIG. 3C, a ruthenium film 213 is grown in the cavity 212 by electroplating using the above two first and second amorphous silicon films 209 and 210 as an electrode. The electroplating conditions are the same as those described in the above first embodiment. The upper surface of the second amorphous silicon film 210 is covered with the above photo-resist film 211. Thus, the ruthenium film 213 is selectively grown in only portions exposed in the cavity 212 of the surfaces of the first and second amorphous silicon films 209 and 210 exposed in the cavity 212 and the upper surface of the contact plug 108. Moreover, the first and second amorphous silicon films 209 and 210 have the conductivity different from each other; therefore, the ruthenium film 213 is faster grown on the first boron-doped amorphous silicon films 209 and the upper surface of the contact plug 108. As a result, the bottom portion of the cavity 212 can be preferentially covered with the ruthenium film 213.

Figure 3D:
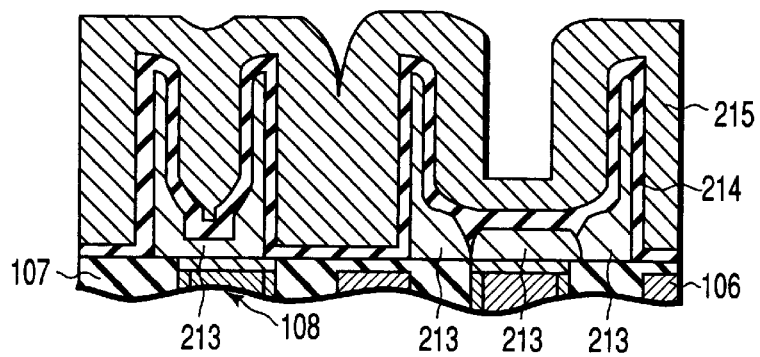

As FIG. 3D depicts, by down flow ashing using 02 and $CF_4$, the photo-resist film 211 is removed. Thereafter, the first and second amorphous silicon films 209 and 210 are removed by a CDE method. The above steps are taken, and thereby a lower cylindrical electrode.

In this second embodiment, the down flow ashing is used to remove the photo-resist film 211. In this case, cleaning by organic solvent or the removal by sulfuric acid hydrogen peroxide mixed solution may be employed as the method for removing the photo-resist film 211. In the above wet etching, ruthenium is not soluble. Moreover, during the removal step of the boron-doped amorphous silicon film, no etching is occurred to the ruthenium film or the silicon oxide film-based interlayer insulating film 107, and therefore, there is no possibility of giving damage to the underlying layer.

Next, a $Ta_2O_5$ film 214 is formed by the CVD method, and then, a tungsten nitride film 215, which becomes a capacitor upper electrode, is formed by the CVD method. The above steps are taken, and thereby, a capacitor is formed. Sequentially, insulating films and interconnection lines are formed, and thereby, a semiconductor device is formed. The steps after that are omitted.

In this second embodiment, the sacrificial layer used as the template for the electroplating growth has a lamination structure comprising two kinds of conductive films having the conductivity different from each other. By doing so, it is possible to distribute a current density inside the cavity when carrying out electroplating. Therefore, it is possible to realize a cylinder shape having high step coverage at the bottom portion.

A plurality of conductive films is formed so that the conductivity becomes low sequentially, and thereby, it is possible to increase an amount of current flowing through the bottom portion of the cavity, and to enhance a growth rate of the electroplating film at the bottom portion of the cavity. By doing so, in the case of the cylindrical electrode, the step coverage becomes higher at the bottom portion; therefore, it is possible to enlarge an electrode effective area. In the case of burying the electroplating film in the cavity when forming a pedestal, columnar or convex electrode and plug, it is possible to enhance a growing speed of the electroplating film at the bottom portion of the cavity; therefore, void and seam formation can be prevented.

In the above second embodiment, the boron-doped amorphous silicon film formed by the CVD method is used as the sacrificial film having the two-layer structure. In order to prevent electrolytic concentration, the boron concentration can be stepwise controlled. Further, metal films having different conductivity are formed by the sputtering method; for example, a film such as titanium, titanium nitride laminated film may be used. Further, a coating film may be used as the method of forming a multi-layer conductive film.

[Third Embodiment]

A method of manufacturing a semiconductor device according to a third embodiment of the present invention will be described below with reference to FIG. 4A to FIG. 4E.

Figure 4A:
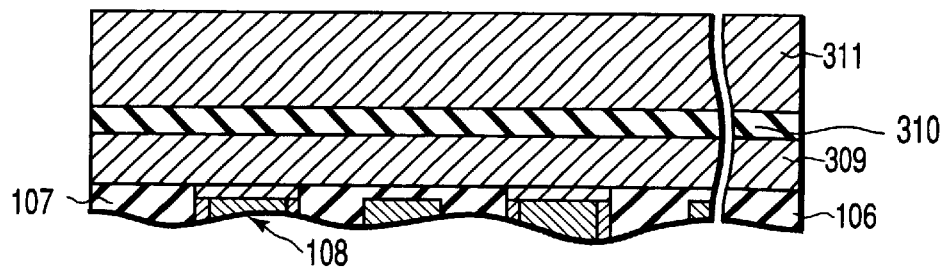
FIG. 4A to FIG. 4E are cross-sectional views showing each step of a method of manufacturing a semiconductor device according to a third embodiment of the present invention.

A structure shown in FIG. 4A is formed using the steps described referring to FIG. 1A in the above first embodiment. In FIG. 4A to FIG. 4E, the above silicon substrate 101, isolation region 102, transistor 103, first interlayer insulating film 104 and contact 105 are not illustrated.

Next, an arsenic-doped first amorphous silicon film 309 having a thickness of 70 nm is formed. Further, an arsenic-doped silicon oxide film 310 having a thickness of 10 nm is formed on the first amorphous silicon film 309. Further, an arsenic-doped second amorphous silicon film 311 having a thickness of 1000 nm is formed on the silicon oxide film 310. In this case, the first amorphous silicon film 309, the silicon oxide film 310 and the second amorphous silicon film 311 are used as a sacrificial layer where a cavity template for electroplating growth is formed.

The first amorphous silicon film 309, the silicon oxide film 310 and the second amorphous silicon film 311 are formed by a thermal CVD method. In this case, a CVD gas of the first and second amorphous silicon films 309 and 311 is $Si_2H_6$ and $B_2H_6$; on the other hand, a CVD gas of the silicon oxide film 310 is $Si_2H_6$, $B_2H_6$, and oxygen. Moreover, the deposition temperature of the first and second amorphous silicon films 309, 311 and the silicon oxide film 309 is 300° C. oxygen is introduced to the deposition atmosphere of the first amorphous silicon film 309, and thereby, the first amorphous silicon film 309 and the silicon oxide film 310 are continuously formed.

Figure 4B:
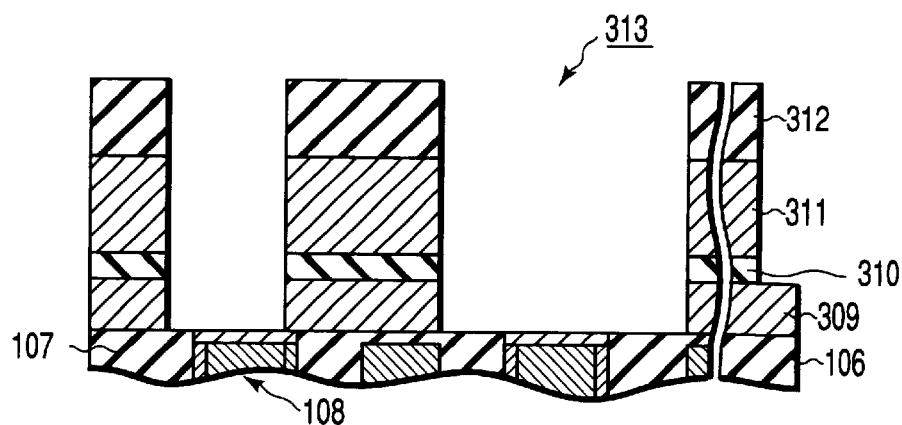

As shown in FIG. 4B, a photo-resist film 312 is coated on the above sacrificial layers 309, 310 and 311. An opening is formed in the photo-resist film 312 by the public-known lithography technology. The sacrificial layers 309, 310 and 311 are etched by RIE using the photo-resist film 312 as a mask so that a cavity 313 can be used as a capacitor template.

Further, the second amorphous silicon film 311 and the silicon oxide film 310 at the edge portion of wafer is etched.

By the above etching, a current is applied to only single layer, that is, only first arsenic-doped amorphous silicon film 309.

Figure 4C:
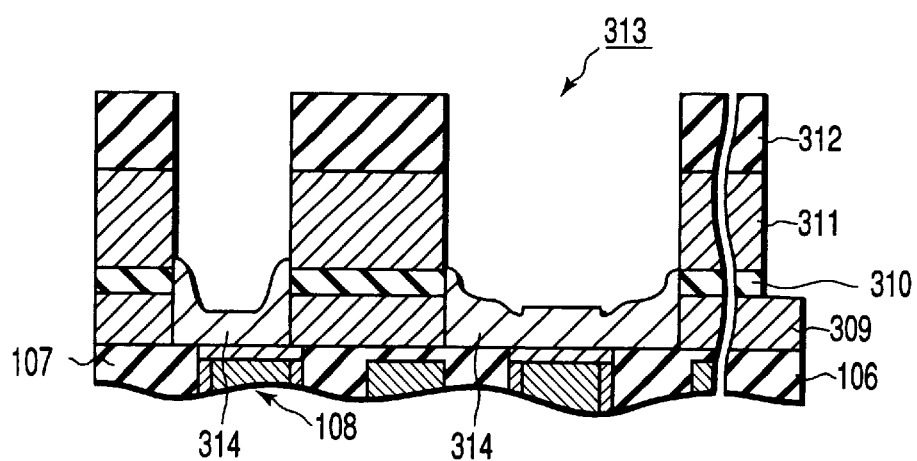

As FIG. 4C shows, a current is applied to only first arsenic-doped amorphous silicon film 309 so that a ruthenium film 314 can be grown at only bottom portion of the cavity 313. The bottom portion of the cavity 313 is fully covered with the ruthenium film 314. In this case, the electroplating conditions are the same as the above first embodiment.

Figure 4D:
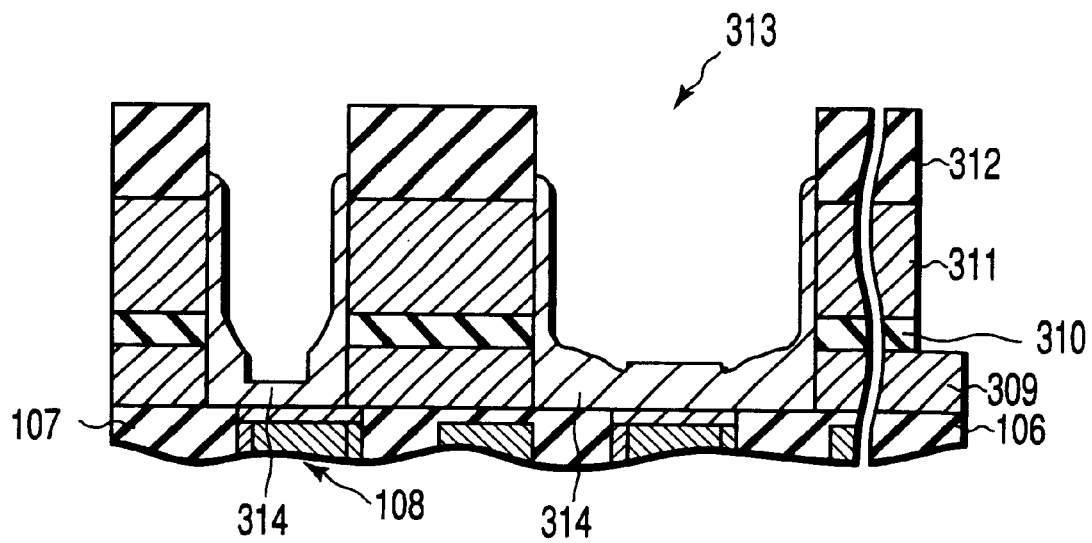

As shown in FIG. 4D, a current is applied to the first and second amorphous silicon films 309 and 311. By the above current application, the ruthenium film 314 is grown at the entire sidewall of the cavity 313 so that a cylinder-shaped electrode can be formed. The upper surface of the second arsenic-doped amorphous silicon film 311 is covered with the photo-resist film 312. Thus, the ruthenium film 314 is selectively grown in only portions exposed in the cavity 313 of the surfaces of the first and second arsenic-doped amorphous silicon films 309 and 311 exposed in the cavity 313 and the upper surface of the contact plug 108.

Figure 4E:
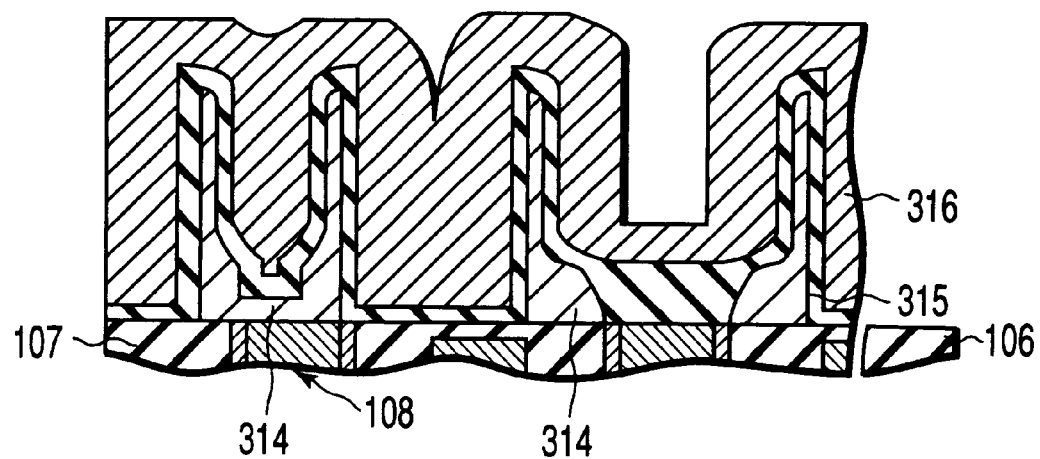

As illustrated in FIG. 4E, by down flow ashing using $O_2$ and $CF_4$, the photo-resist film 312 is removed. Thereafter, the first and second amorphous silicon films 309, 311 and the silicon oxide film 310 are removed by the CDE method.

In this third embodiment, the down flow ashing is used to remove the photo-resist film 312. In this case, cleaning by organic solvent or the removal by sulfuric acid hydrogen peroxide mixed solution may be employed as the method for removing the photo-resist film 211. In the above wet etching, ruthenium is not soluble.

Moreover, the thickness of the silicon oxide film 310 is thin. Therefore, the silicon oxide film 310 can be removed by the CED method. During the removal step of the arsenic-doped amorphous silicon film, no etching is subjected to the ruthenium film; therefore, there is no possibility of giving damage to the front-end. The above steps are taken, and thereby, a capacitor cylindrical lower electrode e is formed.

A $Ta_2O_5$ film 214 is formed by the ALD method, and then, a tungsten nitride film 215, which becomes a capacitor upper electrode, is formed by the CVD method. The above steps are taken, and thereby, a capacitor element is formed.

Insulating films and interconnection lines are formed, and thereby, a semiconductor device is formed. The steps after that are omitted.

In this third embodiment, the sacrificial film has a metal-insulator-metal lamination structure (MIM structure). By doing so, it is possible to independently control the growth of electroplating film at the bottom portion of the cavity and the growth of electroplating film at other portions exceeding the bottom portion. The ruthenium film is first grown at the bottom portion of the cavity by electroplating, and sequentially, is grown at the upper portion of the cavity. Therefore, it is possible to realize a cylinder shape having better step coverage at the bottom portion like the above second embodiment, and to realize control performance higher than the second embodiment.

In the case of the cylindrical electrode, the step coverage becomes higher at the bottom portion; therefore, it is possible to enlarge an electrode effective area. In the case of burying the electroplating film in the cavity when forming a column electrode and plug, it is possible to enhance a growth rate of the electroplating film at the bottom portion of the cavity; therefore, void and seam formation can be prevented.

In the above third embodiment, the sacrificial film having the MIM structure is deposited by CVD. In this case, a film deposited by sputtering or a coating film may be used as the sacrificial film.

[Fourth Embodiment]

A method of manufacturing a semiconductor device according to a fourth embodiment of the present invention will be described below with reference to FIG. 5A to FIG. 5D.

Figure 5A:
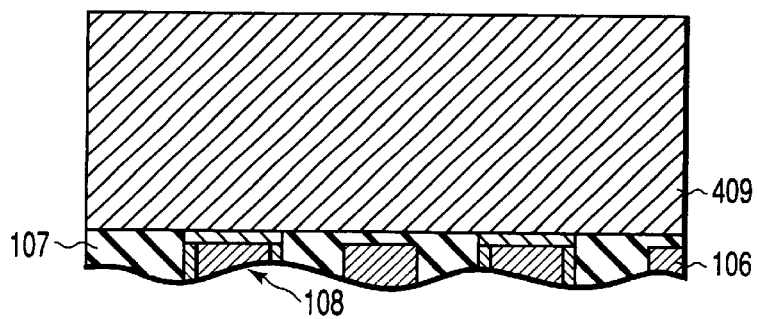
FIG. 5A to FIG. 5D are cross-sectional views showing each step of a method of manufacturing a semiconductor device according to a fourth embodiment of the present invention.

A structure as shown in FIG. 5A is formed using the steps described referring to FIG. 1A in the above first embodiment. In FIG. 5A to FIG. 5D, the above silicon substrate 101, isolaion region 102, transistor 103, first interlayer insulating film 104 and contact 105 are not illustrated.

As shown in FIG. 5A, an aluminum film 409 having a thickness of 1 μm is deposited as a sacrificial layer of a template for the electroplating growth by sputtering.

Figure 5B:
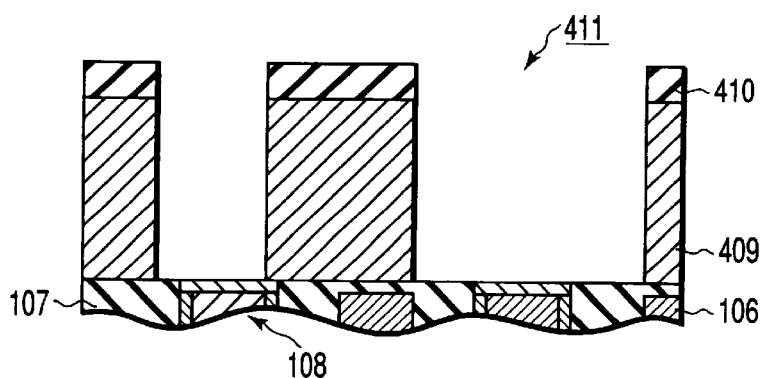

As shown in FIG. 5B, an alumina film 410 is formed on the surface of the aluminum film 409. The surface of the aluminum film 409 is oxidized by an RTA (Rapid Thermal Annealing) method, and thereby, the alumina film 410 is formed.

The alumina film 410 is coated with a photo-resist film. An opening is formed in the photo-resist film by the public-known lithography technology. The alumina film 410 and the aluminum film 409 are etched by the RIE method using the photo-resist film as a mask so that a cavity 411 can be used as a capacitor template. The photo-resist film is removed by down flow ashing.

Figure 5C:
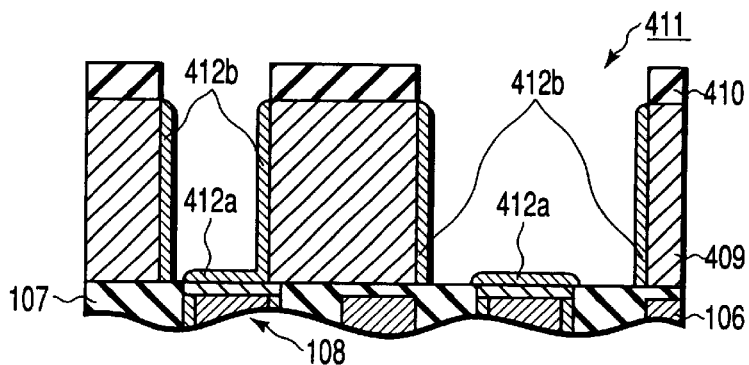

As FIG. 5C shows, a ruthenium film 412 is grown in the cavity by electroplating using the aluminum film 409 as an electrode. The electroplating conditions are the same as the first embodiment.

The upper surface of the aluminum film 409 is coated with the alumina film 410. Thus, the ruthenium film 412 is selectively grown in only portions exposed in the cavity 411 of the surfaces of the aluminum film 409 exposed in the cavity 411 and the upper surface of the contact plug 108. The electroplating time is controlled, and thereby, the ruthenium film having a desired thickness is formed.

Figure 5D:
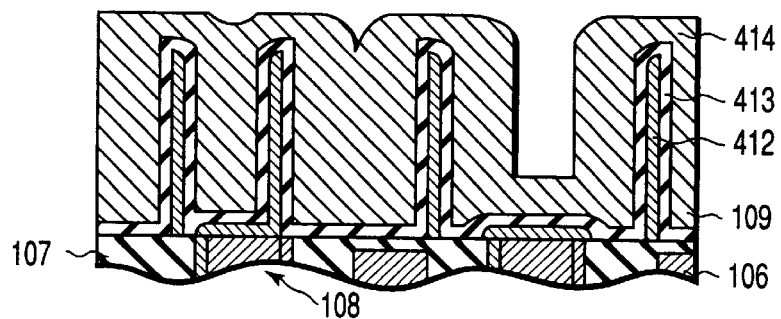

As depicted in FIG. 5D, the alumina film 410 and the aluminum film 409 are removed by wet etching using hydrochloric acid hydrogen peroxide mixed solution. In the above wet etching, no etching is subjected to the ruthenium film 412 and silicon oxide film-based interlayer insulating film 107. As a result, there is no possibility of giving damage to the front-end. The above steps are taken, and thereby, a capacitor lower cylindrical is formed. A $Ta_2O_5$ film 413 is formed by the ALD method, and then, a ruthenium film 414, which becomes a capacitor upper electrode, is formed by the CVD method. The above steps are taken, and thereby, a capacitor is formed.

Insulating films and interconnection lines are formed, and thereby, a semiconductor device is formed. The steps after that are omitted.

In the fourth embodiment, the aluminum film is used; in this case, metal films such as titanium, tungsten or titanium nitride may be used. Further, the aluminum film is oxidized so that the alumina film 409 can be formed; in this case, the alumina film can be formed by sputtering.

In this fourth embodiment, a laminated film comprising aluminum and alumina films is used as the sacrificial film. The aluminum film is already used widely in LSI interconnection process, and deposition technology is established. In particular, it is required to form a micron-order film thickness in case of the sacrificial film for such as cylindrical electrode. However, in the LSI interconnection process, there is a merit that the deposition technology of micron-order aluminum film is established. Further, the alumina film is used as an insulating film for selectively carrying out electroplating, and thereby, it is possible to form the insulating film by the oxidization of the aluminum film.

[Fifth Embodiment]

A method of manufacturing a semiconductor device according to a fifth embodiment of the present invention will be described below with reference to FIG. 6A to FIG. 6F.

Figure 6A:
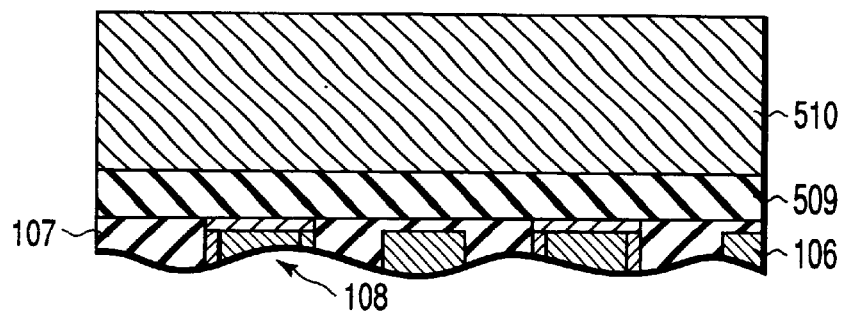
FIG. 6A to FIG. 6F are cross-sectional views showing each step of a method of manufacturing a semiconductor device according to a fifth embodiment of the present invention.

A structure as shown in FIG. 6A is formed using the steps described referring to FIG. 1A in the above first embodiment. In FIG. 6A to FIG. 6F, the above silicon substrate 101, isolation region 102, transistor 103, first interlayer insulating film 104 and contact 105 are not illustrated.

Next, a silicon nitride film 509 is formed by LPCVD so as to have a thickness of 50 nm. Then, an aluminum film 510 having a thickness of 1 μm is formed on the silicon nitride film 509 by sputtering.

Figure 6B:
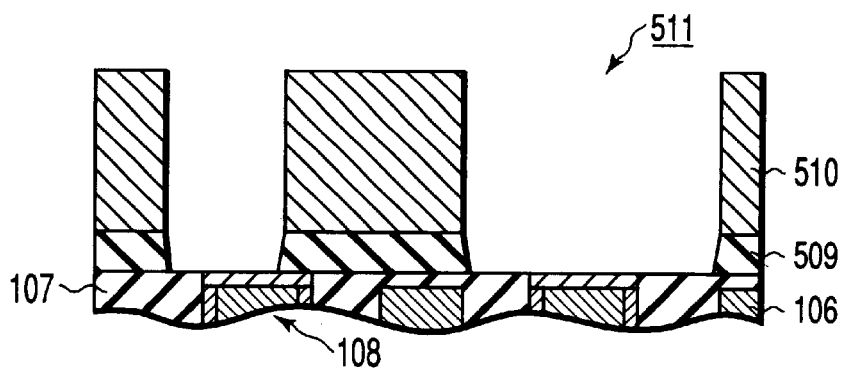

As FIG. 6B shows, the aluminum film 510 is coated with a photo-resist film. An opening is formed in the photo-resist film of capacitor forming region by the public-known lithography technology. The aluminum film 510 and the silicon nitride film 509 are etched from the opening of the resist film by the RIE technology. The resist film is removed by ashing to form a cavity 511 where a capacitor electrode is formed. In the above RIE, the sidewall of the aluminum film 510 is formed so that the sidewall has an angle of 89°. The silicon nitride film 509 is tapered so as to have an angle from 80° to 85°.

Figure 6C:
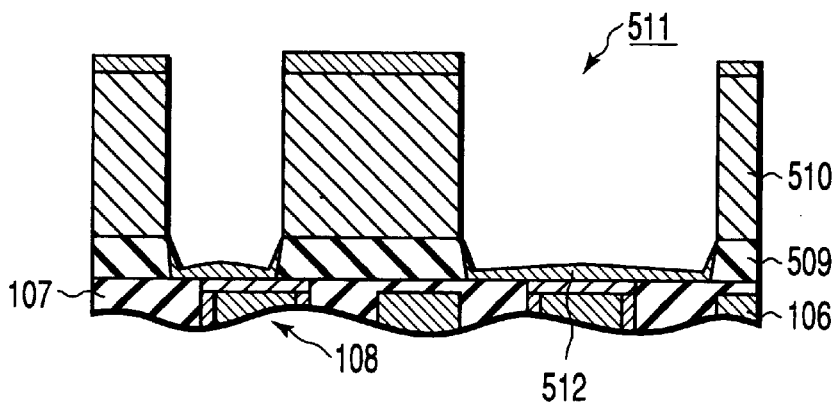

Sequentially, as shown in FIG. 6C, a ruthenium film 512 having a thickness of 20 nm is formed on the entire surface of the substrate by an LTS (Long Throw Sputter) method. The following is a description of the ruthenium film 512, which is formed on the sidewall of the cavity 511. The ruthenium film 512 is formed on the surface of the aluminum film 510 having a side face approximately vertical to the main surface of the substrate. The ruthenium film 512 has an extremely thin and non-uniform thickness. However, the ruthenium film 512 formed on the surface of the tapered silicon nitride film 509 and the bottom surface of the cavity 511 has a almost uniform thickness.

Figure 6D:
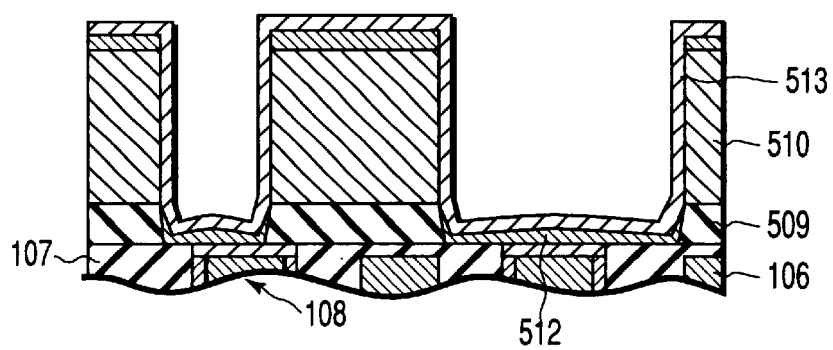

As shown in FIG. 6D, the ruthenium film 512 and the aluminum film 510 are used as a seed layer so that a ruthenium film 513 can be selectively grown in the cavity 511 by electroplating. The electroplating conditions are the same as the first embodiment.

The ruthenium film 513 formed by electroplating is grown approximately isotropic from the aluminum film 510 or the ruthenium film 512.

Figure 6E:
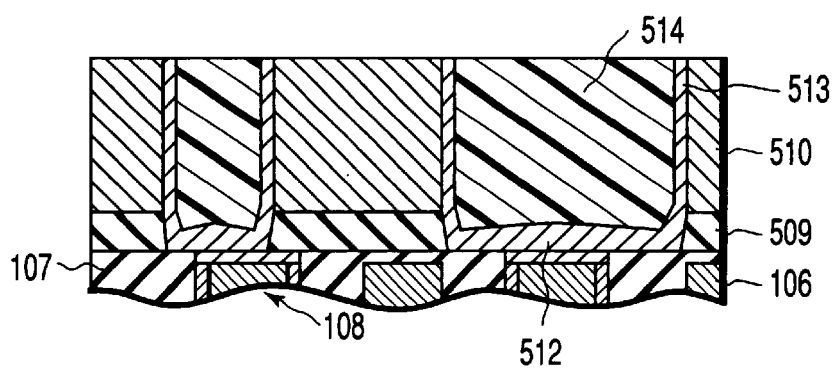

As in FIG. 6E depicts, the entire surface of the substrate is coated with a resist film so that a photo-resist film 514 can be buried in the cavity 511. Next, the photo-resist film 514 and the ruthenium film 513 out of the cavity are removed by CMP technology. The above steps are taken, and thereby, the ruthenium film 513 remains only in the cavity 511.

Figure 6F:
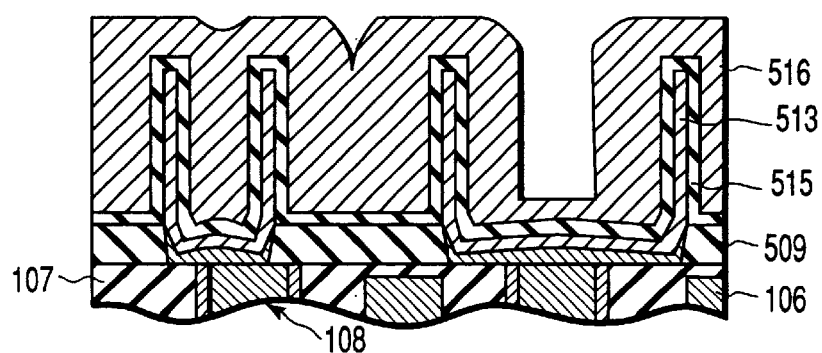

As FIG. 6F shows, the above photo-resist film 514 is removed by a down flow usher, and then, the aluminum film 510 is removed by wet etching using hydrochloric acid hydrogen peroxide mixed solution so that a capacitor lower electrode can be formed.

Next, a $Ta_2O_5$ film 515 and a ruthenium film 516 to be an upper electrode are formed by the CVD method. Next, the ruthenium film is patterned by the photolithography technology and the RIE technology, and thereby, a memory cell region is formed. Sequentially, insulating films and interconnection lines are formed, and thereby, a semiconductor device is formed. The steps after that are omitted.

In the fifth embodiment, the conductive sacrificial film and the ruthenium formed by the long slow sputtering (LTS) method are both used as the seed layer for electroplating, and thereby, it is possible to form a capacitor lower electrode deeply buried in a support film. By this invention, even if the lower electrode having a large aspect ratio is formed, it is possible to prevent electrode collapse. The technology of forming the seed layer by sputtering is used in the LSI interconnection step as the method for forming the electroplating film in the hole (cavity). However, in the case of forming the seed film by sputtering so that the sidewall of the hole (cavity) can be coated, the seed film must be sputtered thicker, as described before. For this reason, in the case of forming the cylindrical structure, there is a problem that the thickness of the cylinder sidewall becomes too thicker. According to this fifth embodiment, a sputtered film should only keep an electrical connection with the conductive sacrificial layer, but need not to be uniformly formed. Therefore, this fifth embodiment has the following merits. That is, there is no problem even if almost no sputtered film is formed on the sidewall of the cavity. In this manufacturing method, even if the misalignment is generated between the electrode and the contact plug, the top surface of the contact plug is not exposed under oxidizing atmosphere in depositing the dielectric film.

Moreover, in the fifth embodiment, the aluminum film is used as the sacrificial layer; in this case, a carbon film may be used. In the case where the carbon film has been used, the ruthenium film formed on the upper surface of the sacrificial layer can be more easily removed by CMP. Further, it is possible to simultaneously remove the resist film buried in the cavity by the usher and the carbon film of the sacrificial layer; therefore, it is effective to reduce the number of processes.

[Sixth Embodiment]

A method of manufacturing a semiconductor device according to a sixth embodiment of the present invention will be described below with reference to FIG. 7A to FIG. 7D. In this sixth embodiment, a laminated film comprising a tantalum film and an SOG film is used as the sacrificial layer, and then, a column-shaped electrode to be a BST lower electrode is formed.

Figure 7A:
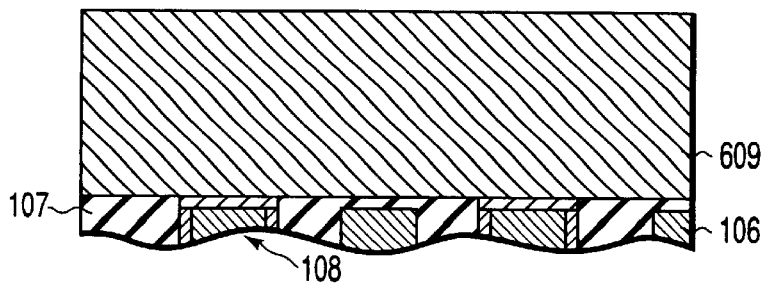
FIG. 7A to FIG. 7D are cross-sectional views showing each step of a method of manufacturing a semiconductor device according to a sixth embodiment of the present invention.

A structure shown in FIG. 7A is formed using the steps described referring to FIG. 1A in the above first embodiment. In FIG. 7A to FIG. 7D, the above silicon substrate 101, isolation region 102, transistor 103, first interlayer insulating film 104 and contact 105 are not illustrated.

Next, a tantalum film 609 having a thickness of 1 μm is deposited as the sacrificial layer by sputtering.

Figure 7B:
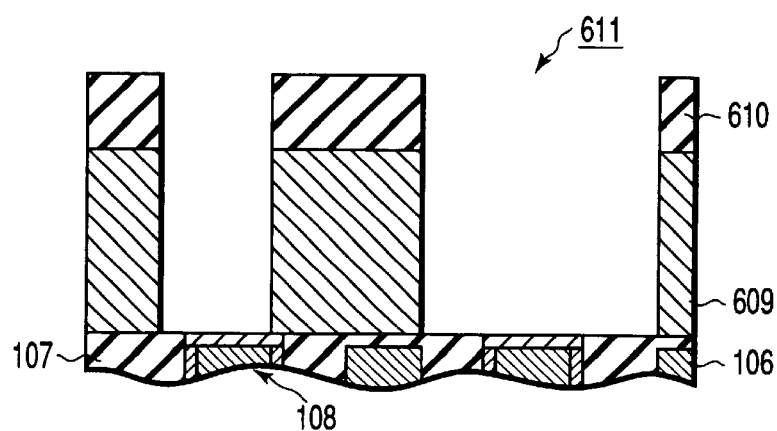

As shown in FIG. 7B, an SOG film 610 is coated on the tantalum film 609 so as to have a thickness of 60 nm. Next, the SOG film 610 is subjected to patterning by the publicknown lithography technology. The tantalum film 609 is processed (etched) by RIE using the SOG film 610 as a hard mask so that a cavity 611 can be formed as a capacitor template.

Figure 7C:
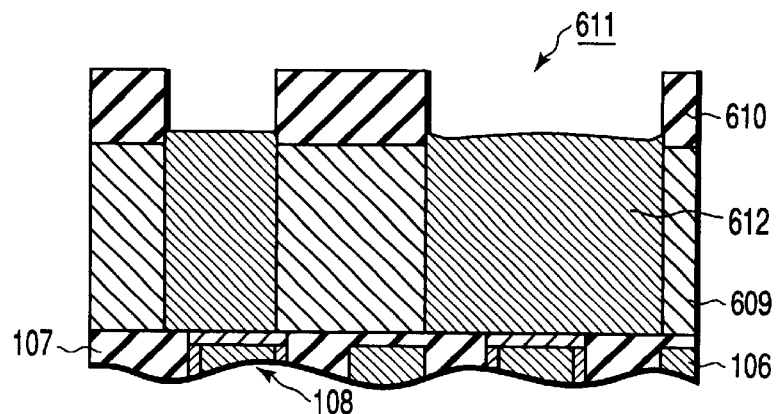

As FIG. 7C shows, a ruthenium film 612 is grown in the cavity 611 by electroplating using the tantalum film 609 as the seed layer. The electroplating conditions are the same as the first embodiment. However, in the sixth embodiment, it is an object to form a BST capacitor column-shaped electrode. Therefore, the constituent feature is that the ruthenium film 612 is fully buried in the cavity 611. In this case, the upper surface of the tantalum film 609 is coated with the SOG film 610; therefore, the ruthenium film 612 is selectively grown in only cavity 611.

Figure 7D:
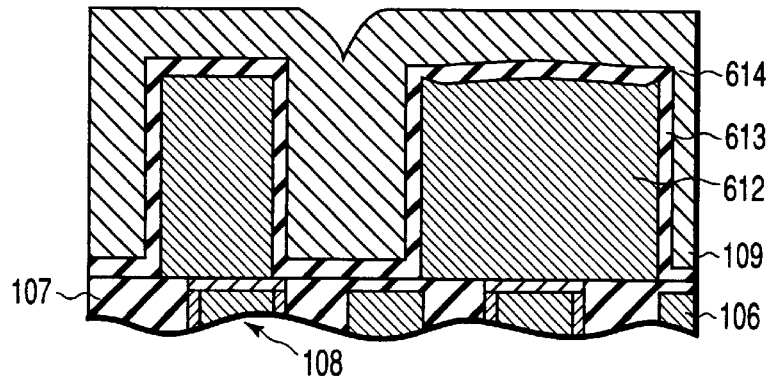

As shown in FIG. 7D, the SOG film 610 is removed by wet etching using hydrofluoric acid. As already described, the tantalum film is not soluble in the hydrofluoric acid, and the ruthenium film 612 is fully buried in the cavity 611; therefore, no influence is given to the underlying layer. Next, in CF4 plasma, the tantalum film 609 is selectively removed by dry etching, and thereby, a column-shaped capacitor lower electrode can be formed. Next, a BST film 613 and a ruthenium film 614 to be a capacitor upper electrode are formed by the CVD method, and thereby, a capacitor can be formed. Next, insulating films and interconnection lines are formed, and thereby, a semiconductor device is formed. The steps after that are omitted.

In this sixth embodiment, the cylindrical electrode is formed using the structure of the sacrificial layer described in the first embodiment. In this case, the pedestal, columnar or convex electrode is formed using the structure of the sacrificial layer described in the second to fifth embodiments

[Seventh Embodiment]

A method of manufacturing a semiconductor device according to a seventh embodiment of the present invention will be described below with reference to FIG. 8A to FIG. 8E. In the seventh embodiment, a platinum electrode to be a PZT (Pb (Zr, Ti) $O_3$) film electrode is formed on a platinum contact plug. Although it is difficult to process a Pt film by the CVD and RIE methods, according to the present invention, it is possible to form the Pt electrodes without RIE by use of the selective growth.

Figure 8A:
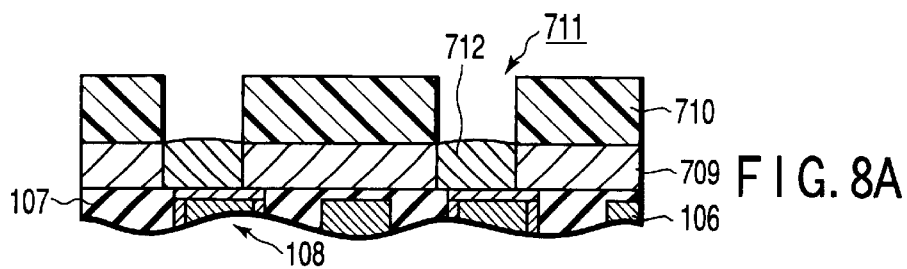
FIG. 8A to FIG. 8E are cross-sectional views showing each step of a method of manufacturing a semiconductor device according to a seventh embodiment of the present invention.

A structure shown in FIG. 8A is formed using the steps described referring to FIG. 1A in the above first embodiment. In FIG. 8A to FIG. 8E, the above silicon substrate 101, isolation region 102, transistor 103, first interlayer insulating film 104 and contact 105 are not illustrated.

Next, an aluminum film 709 is formed to have a thickness of 500 nm by the sputtering method. The entire surface of the aluminum film is coated with a photo-resist film 710. The photo-resist 710 mask pattern is formed with a normal photolithography technology. The aluminum film 709 is etched by RIE technology using the photo-resist film 710 as a mask so that a cavity 711 connecting with a plug electrode can be formed. In this case, the photo-resist film 710 is not removed, and remains therein. Next, a platinum film 712 is buried and formed in the cavity 711 by electroplating. The electroplating conditions for forming the platinum film are as follows.

An electroplating solution consists of $PtCl_4 5H_2O$ (5 to 100 g/L), HCl (5 to 100 g/L), $NH_4Cl$ (10 to 100 g/L) and $NH_3$ (28% aqueous solution). A pH of the electroplating solution is set to a range from 0.5 to 2.5. The electroplating solution temperature is set to room temperature. A current density is set to a range from 0.005 to 0.1 A/cm$^2$. The upper surface of the aluminum film 709 is coated with a photo-resist film 708; therefore, the platinum film 712 is selectively grown in only cavity 711.

Figure 8B:
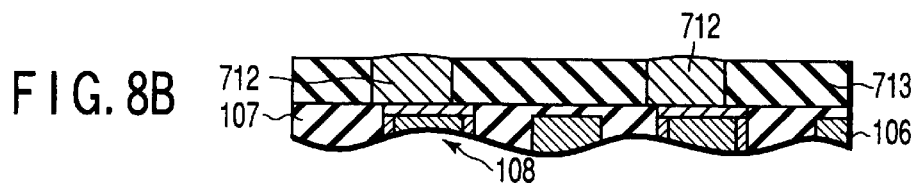

As depicted in FIG. 8B, the photo-resist film 710 is removed by ashing. Then, the aluminum film 709 is removed using the hydrochloric acid hydrogen peroxide mixed solution. A silicon oxide film 713 is formed on the entire surface of the substrate by the plasma CVD method. The surface of the silicon oxide film 713 is planarized by the CMP method. In this case, the surface of the platinum film 712 is exposed. In the above manner, the platinum film 712 columnar contact plug is fabricated.

Figure 8C:
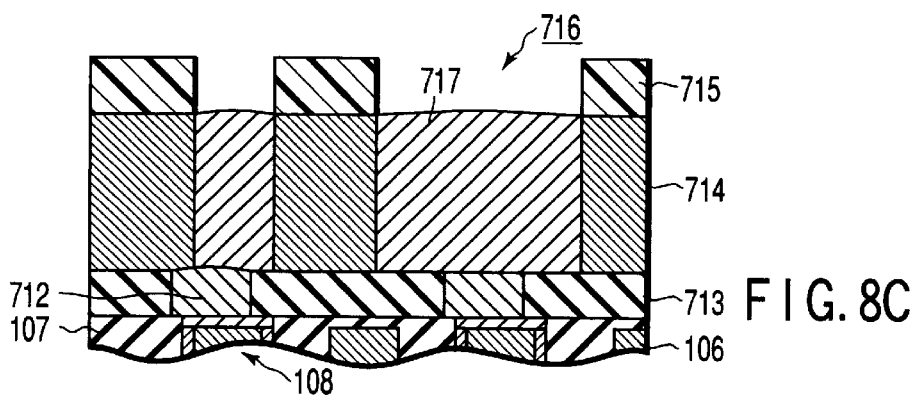

As FIG. 8C shows, an aluminum film 714 is deposited on the entire surface of the substrate by sputtering so as to have a thickness of 1 μm. The entire surface is coated with a photo-resist film 715. The photo-resist film 715 is formed with an opening by normal photolithography technology. The aluminum film 714 is etched by RIE technology using the photo-resist film 715 as a mask so that a cavity 716 communicating with the platinum film 712 can be formed. In this case, the photo-resist film 715 is not removed, and remains therein. Next, a platinum film 717 is buried and formed in the cavity 711 by electroplating. The electroplating conditions for forming the platinum film 717 are the same as those in forming the plug 712.

Figure 8D:
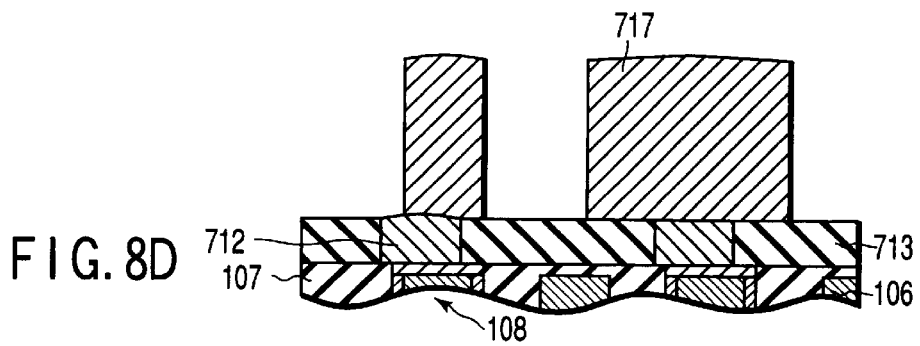
Figure 8E:
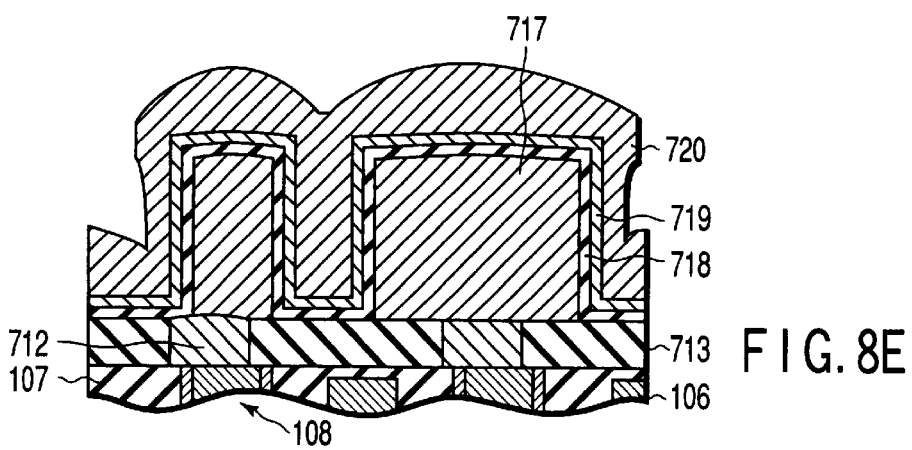
Figure 9A:
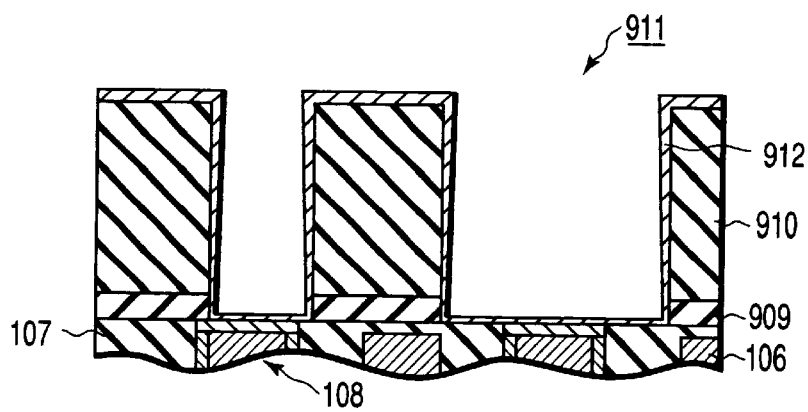
FIG. 9A to FIG. 9D are cross-sectional views showing each step of a conventional method of manufacturing a semiconductor device.
Figure 9B:
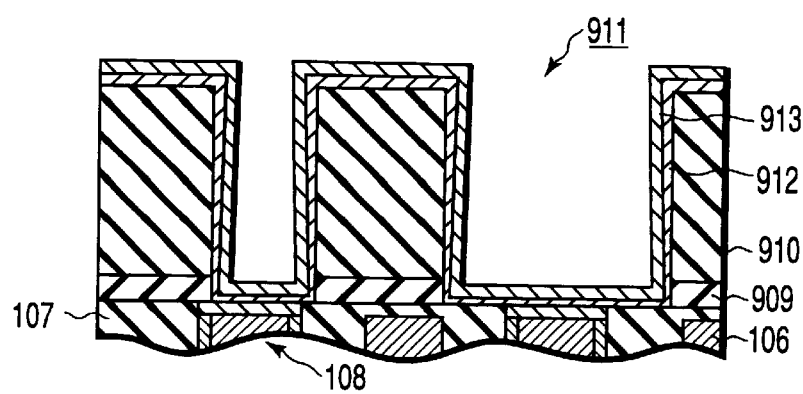
Figure 9C:
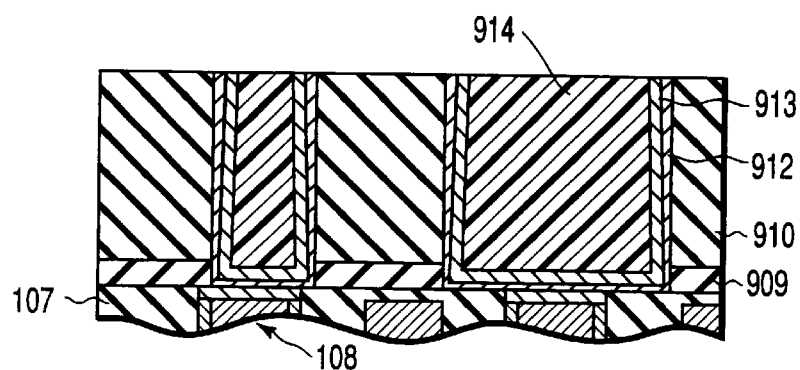
Figure 9D:
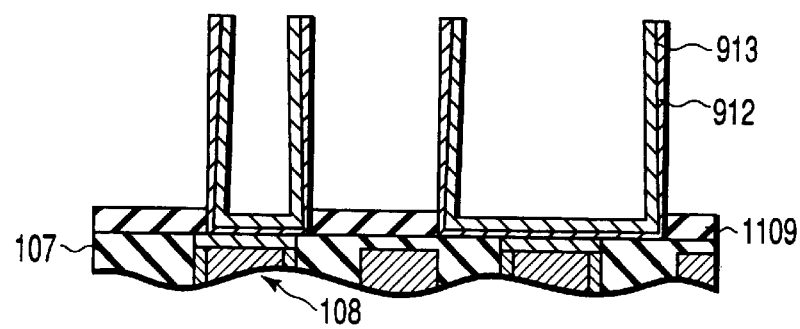

As illustrated in FIG. 8D, the above photo-resist film 715 and the aluminum film 714 are removed by wet etching using a heated hydrochloric acid hydrogen peroxide mixed solution. The above steps are taken, and thereby, a capacitor electrode is formed.

As FIG. 8D depicts, a Pb (Zr, Ti) $O_3$ film 718 of a thickness of 30 nm is formed by the CVD method. Further, a platinum film 719 to be an upper electrode and a titanium nitride film 720 are sequentially formed by sputtering so as to have a thickness of 5 nm and a thickness of 100 nm, respectively. The platinum film 719 and the titanium nitride film 720 are processed by photolithography technology and RIE technology, and thereby, a memory cell region is formed. Insulating films and interconnection lines are formed, and thereby, a semiconductor device is formed. The steps after that are omitted.

In this seventh embodiment, in place of platinum, an iridium film to be $SrBiTa_2O_9$ film electrode is applicable. As described above, it is possible to form the plug electrode comprising iridium and the lower electrode by only electroplating. No RIE with respect to iridium is required in forming the lower electrode.

The electroplating conditions for forming the iridium film are as follows. An electroplating solution consists of $(NH_4)_2IrCl_6$ (5 to 15 g/L), $(NH_4)_2SO_4$ (1 to 50 g/L) and $H_2SO_4$ (02. to 2 g/L). A pH of the electroplating solution is set to a range from 0.5 to 3.5. The electroplating solution temperature is set to a range from 30° C. to 50° C. A current density is set to a range from 0.005 to 0.05 $A/cm^2$.

In the seventh embodiment, the pedestal electrode is formed as the lower electrode of the capacitor. In this case, the cylindrical, columnar or convex electrode may be formed using the manufacturing methods described in the first to fifth embodiments.

In the embodiments described above, the ruthenium film, platinum film and iridium film are used as the electrode film. The present invention is not limited to the metal film, and the following metal materials such as palladium Pd), rhodium (Rh), rhenium (Re) and osmium (Os) may be used. Further, the present invention is not limited to only noble metal formation, and is effective in the case of burying and processing metal film such as nickel, which is hard to carry out the CVD and RIE methods.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming a sacrificial layer including one or more conductive film on a semiconductor substrate;

forming a cavity used as a template of electroplating in the sacrificial layer;

growing a metal film on a surface of the cavity by the electroplating using the conductive layer as a seed layer so that a cylindrical, pedestal, columnar or convex electrode can be formed; and removing the sacrificial layer so that the electrode can be exposed.

2. The method of manufacturing a semiconductor device according to claim 1, further comprising:

forming a capacitor including the electrode, a metal oxide dielectric film, and an upper electrode;

forming the capacitor including sequentially depositing the metal oxide dielectric film and the upper electrode on the surface of the electrode after the electrode is exposed.

3. The method of manufacturing a semiconductor device according to claim 1, wherein a insulating layer is formed as the uppermost layer of the sacrificial layer for electroplating inhibition layer, and the metal film is selectively formed on the inner surface of the cavity.

4. The method of manufacturing a semiconductor device according to claim 3, wherein a photo-resist film is formed as the electroplating inhibition layer, and the cavity is formed by etching of the sacrificial layer using the photo-resist film as a mask.

5. The method of manufacturing a semiconductor device according to claim 3, wherein the electroplating inhibition layer is formed by oxidizing an upper surface of the conductive film.

6. The method of manufacturing a semiconductor device according to claim 1, further comprising:

forming a plurality of conductive films as the sacrificial layer so that a conductivity becomes lower in succession.

7. The method of manufacturing a semiconductor device according to claim 6, wherein an insulating electroplating inhibition layer is formed as the uppermost layer of the sacrificial layer, and the metal film is selectively formed on the surface of the cavity.

8. The method of manufacturing a semiconductor device according to claim 1, further comprising:

forming the sacrificial layer including sequentially forming a first conductive film, an insulating film and a second conductive film, the metal film growth including:

growing the metal film in the cavity using only first conductive film as a seed layer; and growing the metal film by electroplating using the first and second conductive films as seed layers.

9. The method of a manufacturing semiconductor device according to claim 8., wherein an insulating electroplating inhibition layer is formed as the uppermost layer of the sacrificial layer, and the metal film is selectively formed on the surface of the cavity.

10. The method of manufacturing a semiconductor device according to claim 1, wherein a insulating support layer is formed as the lowermost layer of the sacrificial layer;

forming a conductive sputtered film by sputtering on the surface of the cavity and the sacrificial layer before the metal film is grown by electroplating;

forming the electrode by growing the metal film by the electroplating using the conductive sputtered layer and the conductive film as a seed layer; and removing the conductive film while remaining(?) the support layer when removing the sacrificial layer.

11. The method of manufacturing a semiconductor device according to claim 1, wherein a carbon film is formed as the conductive film.

12. The method of manufacturing a semiconductor device according to claim 1, further comprising:

growing a film including any one or more elements of Pt, Pd, Ru, Rh, Re, Os and Ir as the metal film.

13. A method of manufacturing a semiconductor device comprising:

forming a sacrificial layer including a conductive film and an insulating electroplating inhibition layer on a top surface of the sacrificial layer;

forming a cavity used as a template of electroplating in the sacrificial layer;

forming a columnar contact electrode in the cavity by the electroplating using the conductive layer as a seed layer;

removing the sacrificial layer so that an upper surface of the contact electrode can be exposed;

forming an interlayer insulating film covering the contact electrode after the upper surface of the contact electrode is exposed; and etching back an surface of the interlayer insulating film.

14. The method of manufacturing a semiconductor device according to claim 13 further comprising:

forming a sacrificial layer including one or more conductive film on the interlayer insulating layer and the contact electrode;

forming a cavity used as a template of electroplating in the sacrificial layer so that the contact electrode can be exposed;

growing a metal film on a surface of the cavity by the electroplating using the conductive layer as a seed layer so that a cylindrical, pedestal, columnar or convex electrode can be formed; and removing the sacrificial layer so that a lower electrode can be exposed.

15. The method of manufacturing a semiconductor device according to claim 14, further comprising:

forming a capacitor including the electrode, a metal oxide dielectric film, and an upper electrode;

forming the capacitor including sequentially depositing the metal oxide dielectric film and the upper electrode on the surface of the electrode after the electrode surface is exposed.

16. The method of manufacturing a semiconductor device according to claim 13, further comprising:

growing a film including any one or more elements of Pt, Pd, Ru, Rh, Re, Os and Ir as the metal film.

* * * * *